(12) United States Patent  
Matsui et al.

(10) Patent No.: US 7,674,017 B2
(45) Date of Patent: Mar. 9, 2010

(54) OPTICAL MODULE AND MANUFACTURING METHOD THEREOF

(75) Inventors: Jun Matsui, Kawasaki (JP); Koji Terada, Kawasaki (JP); Hiroyuki Nobuhara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/182,717

(22) Filed: Jul. 30, 2008

(65) Prior Publication Data

US 2008/0285303 A1 Nov. 20, 2008

Related U.S. Application Data

(63) Continuation of application No. PCT/JP2006/301535, filed on Jan. 31, 2006.

(51) Int. Cl.
*F21V 29/00* (2006.01)

(52) U.S. Cl. .................. 362/294; 362/373; 362/249.04

(58) Field of Classification Search ............... 362/373, 362/249.04, 294; 257/99
See application file for complete search history.

(56) References Cited

U.S. PATENT DOCUMENTS

| 6,739,760 | B2 | 5/2004 | Cheng et al. |
| 6,828,590 | B2 * | 12/2004 | Hsiung .................. 257/79 |
| 6,863,444 | B2 | 3/2005 | Anderson et al. |
| 6,915,049 | B2 | 7/2005 | Murata |
| 6,920,046 | B2 * | 7/2005 | Spryshak .................. 361/704 |
| 7,058,104 | B2 | 6/2006 | Ueki et al. |
| 7,186,036 | B2 | 3/2007 | Miyamae |
| 7,264,378 | B2 * | 9/2007 | Loh .................. 362/294 |
| 2002/0118924 | A1 | 8/2002 | Murata |
| 2002/0159265 | A1 * | 10/2002 | Rizkin et al. ........ 362/373 |
| 2004/0012964 | A1 * | 1/2004 | Makuta .................. 362/294 |
| 2005/0157986 | A1 | 7/2005 | Miyamae |

FOREIGN PATENT DOCUMENTS

| JP | 2002-250846 | 9/2002 |
| JP | 2003-324233 | 11/2003 |
| JP | 2005-116990 | 4/2005 |
| JP | 2005-208107 | 8/2005 |
| JP | 2005-321655 | 11/2005 |

OTHER PUBLICATIONS

International Search Report mailed Feb. 28, 2006 in connection with the International application No. PCT/JP2006/301535.

* cited by examiner

*Primary Examiner*—Jong-Suk (James) Lee
*Assistant Examiner*—Peggy A. Neils
(74) *Attorney, Agent, or Firm*—Staas & Halsey LLP (57) ABSTRACT

An optical module according to the present invention comprises an electric wiring substrate, a first optical element mounted on the electric wiring substrate so that a heat generation section of the first optical element is positioned relatively close to a substrate surface of the electric wiring substrate and a heat sink mounted on the same plane as the mounting plane of the first optical element on the electric wiring substrate, the heat sink being mounted on the electric wiring substrate so that an area of electric wiring on the electric wiring substrate overlaps the heat sink. This improves the efficiency of heat radiation of the optical module.

9 Claims, 12 Drawing Sheets

OPTICAL MODULE AND MANUFACTURING METHOD THEREOF

CROSS REFERENCE TO RELATED APPLICATIONS

This is a continuing application, filed under 35 U.S.C. §111(a), of International Application PCT/JP2006/301 535, filed Jan. 31, 2006, the contents of which are incorporated herein by reference.

TECHNICAL FIELD

The present invention relates to an optical module, and more particularly to an optical module suitable for use in a data transfer system for next-generation server systems and others.

BACKGROUND ART

A today's data transfer system, for example, a server system, is designed to carry out the data transfer through the use of an optical signal while conducting the data processing by means of an electric signal. An optical module is employed for the data transfer using an optical signal in such a server system. The optical module is a device for making a connection and optical coupling between a photoelectric conversion element and an optical element such as an optical fiber for the propagation of an optical signal.

Concretely, a transmission module, which transmits an optical signal through an optical fiber, can be configured by making a connection between the photoelectric conversion element for the conversion of an electric signal into an optical signal and the optical fiber. While a reception module, which is made to receive an optical signal transmitted through an optical fiber, can be configured by establishing a connection between the photoelectric conversion element for the conversion of an optical signal into an electric signal and the optical fiber.

In addition, the assumption of a server system in the today's development is that a large number of optical modules are packaged in parallel for carrying out the large-scale optical signal parallel transmission. For this reason, the requirement for each optical module is a low dissipation power.

However, although high-speed response needs arise for an optical element along with an increase in data throughput, in a case in which the internal temperature of the optical element increases due to the heat generation resulting from high-speed operations of peripheral circuit elements and the heat generation stemming from the operation of the optical element itself, the optical power decreases. In such a situation, for ensuring the required optical power to be outputted from an optical module, further electric power consumption occurs under constraint.

The optical modules for use in communications, developed so far, have been designed in light of higher-efficiency coupling between an optical element and an optical fiber because of the requirement for the long-distance transmission. In many cases, the lens coupling has been put to use, for that it shows a relatively high coupling efficiency.

Figure 17:
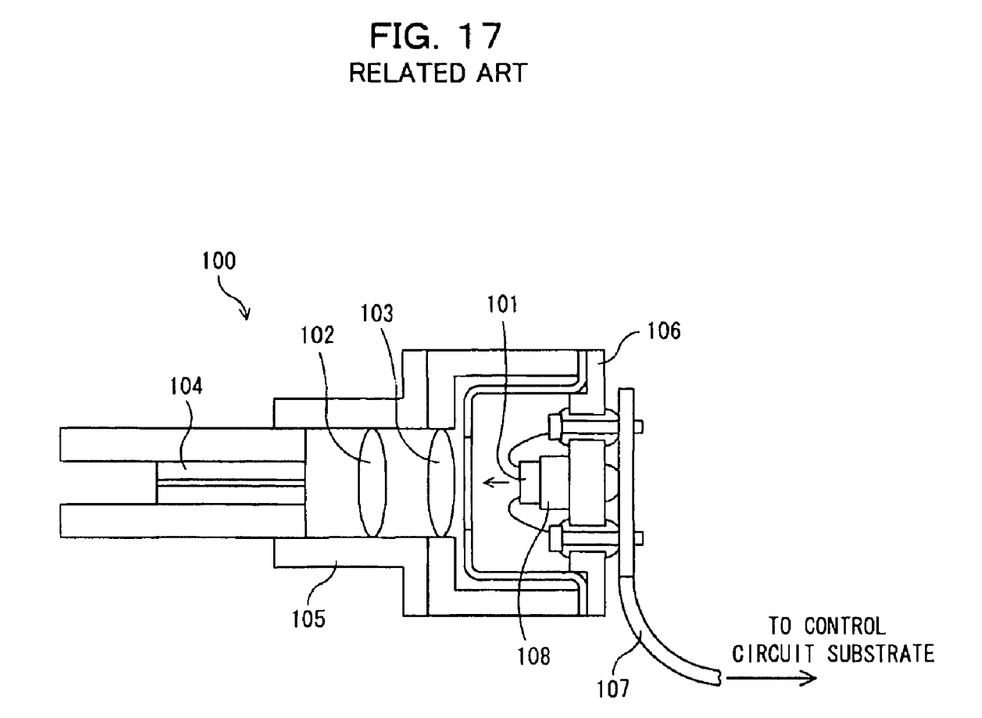
FIG. 17 is an illustration of a related art.

For example, as an optical module employing the aforesaid lens coupling, there has been known a can package type optical module shown in FIG. 17. This optical module 100 shown in FIG. 17 comprises a semiconductor optical element 101 and further includes two lenses 102, 103, a ferrule 104, a window-attached cap 105, a stem 106, a flexible wiring substrate 107 and a heat sink 108. That is, for the fixed connection between the semiconductor optical element 101 and the ferrule 104, there are used the two lenses 102, 103, the window-attached cap 105, the stem 106 and the flexible wiring substrate 107, while for the heat radiation of the heat generation at the semiconductor optical element 101, there is prepared the heat sink 108.

In the above-mentioned conventional optical module 100 shown in FIG. 17, the heat sink 108 is made of a material having a relatively high thermal conductivity and is located on a rear surface of the semiconductor optical element 101. The generated heat from the semiconductor optical element 101 is exhausted through this heat sink 108 toward the stem 106 mounting the semiconductor optical element 101, the flexible wiring substrate 107 and others.

In addition, as the techniques related to the invention of the subject application, there are the following Patent Documents 1 to 4.

Patent Document 1: U.S. Pat. No. 6,739,760
Patent Document 2: U.S. Pat. No. 6,863,444
Patent Document 3: Japanese Patent Laid-Open No. 2005-116990
Patent Document 4: Japanese Patent Laid-Open No. 2003-324233

DISCLOSURE OF THE INVENTION

Problems to be Solved by the Invention

However, in the case of a surface light-emitting type optical element, there arises a problem in that, since a portion where the heating value is high is an active layer to be placed on a light-emitting surface side, the above-mentioned conventional optical module shown in FIG. 17, which is designed such that the heat exhaust is conducted toward the rear surface of the chip, shows a relatively low heat exhaust effect because the heat passes through a semiconductor substrate having a low degree of thermal conductivity.

Also in the case of the Patent Documents 1 to 4, there is no technique which can improve the heat radiation efficiency in such an optical module.

The present invention has been developed in consideration of these problems, and it is an object of the invention to improve the efficiency of heat radiation of an optical module.

Means for Solving the Problems

For this purpose, an optical module according to the present invention comprises an electric wiring substrate, a first optical element mounted on the electric wiring substrate so that a heat generation section of the first optical element is positioned relatively close to a substrate surface of the electric wiring substrate and a heat sink mounted on the same plane as the mounting plane of the first optical element on the electric wiring substrate, wherein the heat sink is mounted on the electric wiring substrate so that an electric wiring area on the electric wiring substrate overlaps the heat sink.

In addition, preferably, an electric wiring section of the electric wiring substrate overlapping the heat sink is connected to a reference electric potential electrode of the first optical element.

Still additionally, preferably, a point connected electrically to an electrode portion of the first optical element in succession to an electric wiring section overlapping the heat sink has a shape with an area larger than that of an electrode portion of the first optical element.

Yet additionally, preferably, the first optical element is made as a surface light-emitting type optical element while a light-emitting section of the surface light-emitting type optical element is mounted on the electric wiring substrate to be positioned relatively close as the heat generation section to the substrate surface side, and a second optical element is mounted on a surface of the electric wiring substrate opposite to the first optical element mounting surface, and an optical propagation path is provided on the electric wiring substrate so that light emitted from the surface light-emitting type optical element propagates and arrives at the second optical element.

Furthermore, an optical module manufacturing method according to the present invention comprises a step of mounting a first optical element on an electric wiring substrate so that a heat generation section of the first optical element is positioned relatively close to a substrate surface side of the electric wiring substrate, and a step of mounting a heat sink on the same plane as a mounting plane of the first optical element on the electric wiring substrate so that an area of electric wiring on the electric wiring substrate overlaps the heat sink.

Advantages and Effects of the Invention

Thus, according to the present invention, an optical module comprises a first optical element mounted on an electric wiring substrate so that a heat generation section thereof is positioned relatively close to a substrate surface side of the electric wiring substrate and a heat sink mounted on the same plane as the mounting plane of the first optical element in the electric wiring substrate, and the heat sink is mounted on the electric wiring substrate so that a portion of electric wiring on the electric wiring substrate overlaps a portion of the main body of the heat sink. This enables the head to be exhausted from the optical element light-emitting side of the surface outputting type optical element 1 which shows a highest heating value, thus eliminating the need to use a heat radiation route toward the rear surface of the surface outputting type optical element 1 which shows a low thermal conductivity, which provides an advantage of enhancing the efficiency of the heat radiation to the exterior of the optical element.

DESCRIPTION OF REFERENCE NUMERALS

1 surface light-emitting type optical element (first optical element)
10, 10-1, 10-2 optical module
10A optical transmitter module
10' optical sub-assembly
11 light-emitting section
121 reference electric potential electrode
122 signal electrode
2 heat sink
21, 21A first heat sink section
22 second heat sink section
211 opening portion
3 electric wiring substrate
32 substrate
33 substrate holding member
34, 34*a* through-hole (optical propagation path)
311, 312, 312-1, 312-2 electric wiring pattern
311*a* signal line
311*a'*, 312*a'* contact portion
312*a* overhanging section
331 adhesion layer
4 fiber block (second optical element)
41 ferrule
42 optical fiber
5 module substrate circuit
51 module substrate
52 electric circuit element
53 drive IC chip
100 optical module
101 semiconductor optical element
102, 103 lens
104 ferrule
105 window-attached cap
106 stem
107 flexible wiring substrate
108 heat sink

BEST MODE FOR CARRYING OUT THE INVENTION

Referring to the drawings, a description will be given hereinbelow of an embodiment of the present invention. The mode carrying out the invention is not limited to the following embodiment. The above-mentioned objects of the present invention, other technical objects, means for solving the technical problems and advantages/effects will become apparent from the following detailed description of the preferred embodiment.

[A] DESCRIPTION OF FIRST EMBODIMENT

Figure 1:
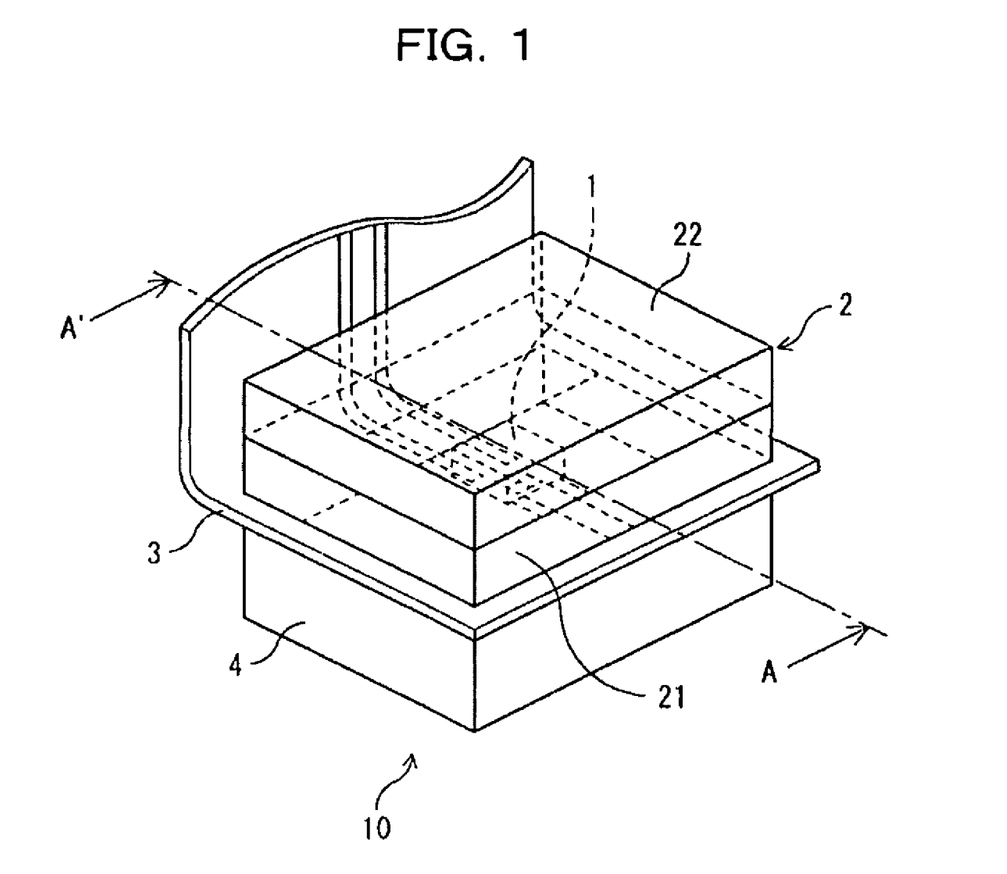
FIG. 1 is an illustration of an optical module according to a first embodiment of the present invention.
Figure 2:
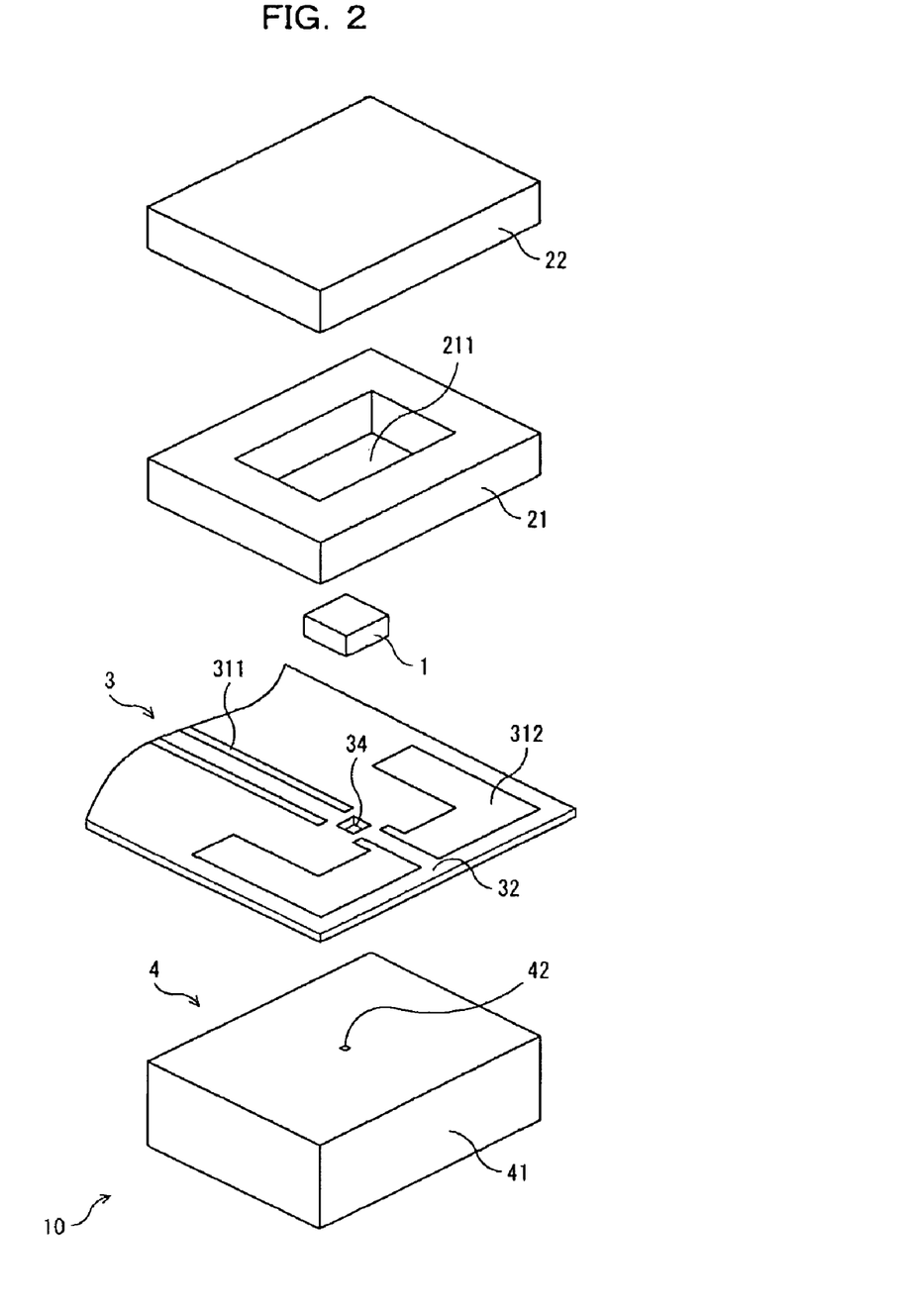
FIG. 2 is an illustration of an optical module according to the first embodiment of the present invention.
Figure 3:
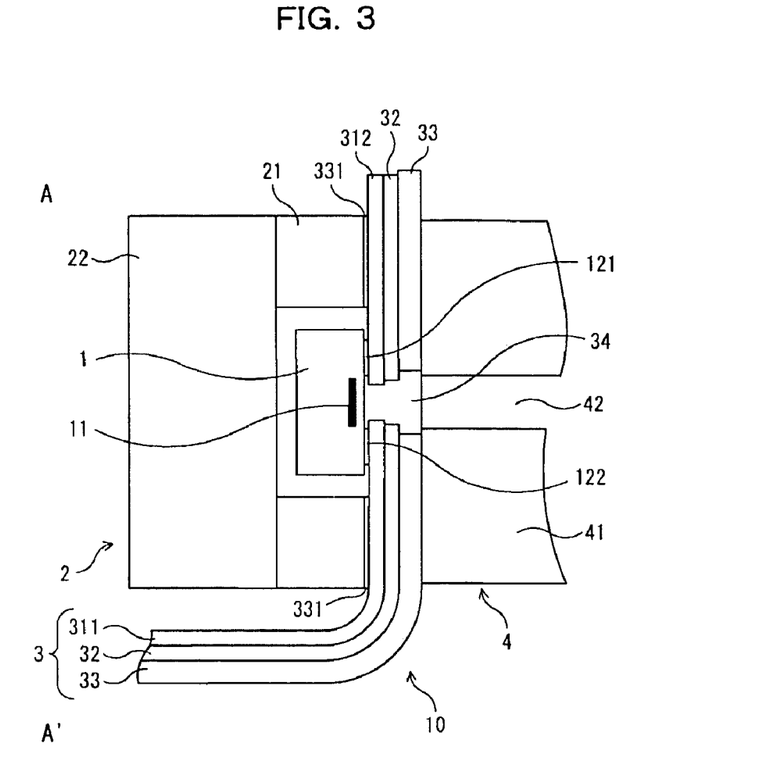
FIG. 3 is an illustration of an optical module according to the first embodiment of the present invention.

FIGS. 1 to 3 are illustrations of an optical module according to a first embodiment of the present invention. FIG. 1 is a perspective view illustratively showing the optical module according to the first embodiment, FIG. 2 is an exploded view of the optical module 10 of FIG. 1, and FIG. 3 is a cross-sectional view showing the optical module 10 of FIG. 1 along an arrow line A-A'.

In this case, the optical module 10 according to the first embodiment comprises a surface light-emitting (outputting) type optical element 1 serving as a first optical element, a heat sink 2, an electric wiring substrate 3 and a fiber block 4 functioning as a second optical element. That is, as shown in FIG. 1, the surface light-emitting type optical element 1 and the heat sink 2 are mounted on one surface of the electric wiring substrate 3 while the fiber block 4 is mounted on the other surface of the electric wiring substrate 3, with they being disposed so as to interpose the electric wiring substrate 3.

As shown in FIG. 2, the electric wiring substrate 3 has electric wiring patterns 311 and 312 formed on a substrate 32 for establishing an electrical connection of the surface light-emitting type optical element 1. In this case, the electric wiring pattern 311 serves as a signal line for the supply of an electric signal to the surface light-emitting type optical element 1 while the electric wiring pattern 312 has a relatively wide area for receiving a power supply or a reference voltage such as a ground voltage or the like.

Moreover, the substrate 32 constituting this electric wiring substrate 3 can be made from a thin flexible wiring film. Thus, as shown in FIG. 3, it is possible to freely shape the electric wiring substrate 3 into a different configuration so as to provide the degree of freedom for the packaging of the optical module 10 into a different apparatus. In FIG. 3, reference numeral 33 designates a substrate holding member provided properly for reinforcing the substrate 32 and keeping the shape thereof, and it constitutes a portion of the electric wiring substrate 3. In addition, in FIGS. 2 and 3, reference numeral 34 represents a through-hole made in the electric wiring substrate 3, which functions as an optical propagation path for leading the light emitted from the surface light-emitting type optical element 1 toward the fiber block 4 side.

Still moreover, for the surface light-emitting type optical element 1, for example, a Bessel-Tomson type light-emitting element is employed and is mounted on the electric wiring substrate 3 so that its own light-emitting section 11 serving as a heat generation section is placed relatively close to the substrate surface side of the electric wiring substrate 3. That is, the surface light-emitting type optical element 1 is flip-chip-mounted to be electrically connected to the electric wiring patterns 311 and 312 of the electric wiring substrate 3 in a state where the light-emitting section 11 thereof faces the electric wiring substrate 3 side.

Figure 4:
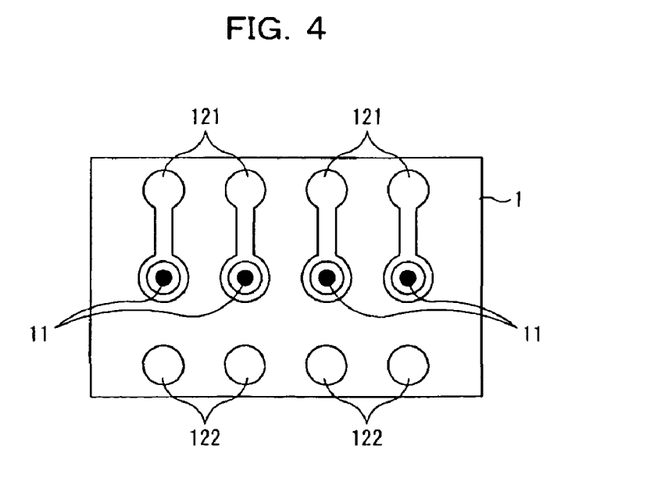
FIG. 4 is an illustration of a surface light-emitting type optical element according to the first embodiment.

That is, as shown in FIGS. 3 and 4, the surface light-emitting type optical element 1 is equipped with a reference electric potential electrode(s) 121 and a signal electrode (s) 122 on the same plane as the light-emitting surface of the light-emitting section 11, and the reference electric potential electrode 121 is connected to the electric wiring pattern 312 (for applying a reference electric potential such as a power supply voltage or a ground voltage), and the signal electrode 122 is connected to the electric wiring pattern 311 (functioning as a signal line). In this way, the surface light-emitting type optical element 1 is mounted on the electric wiring substrate 3.

Figure 5:
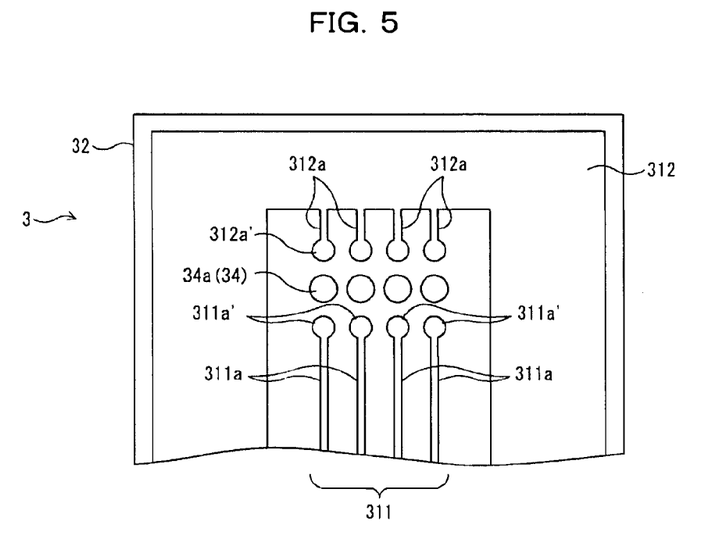
FIG. 5 is an electric wiring substrate according to the first embodiment.
Figure 6:
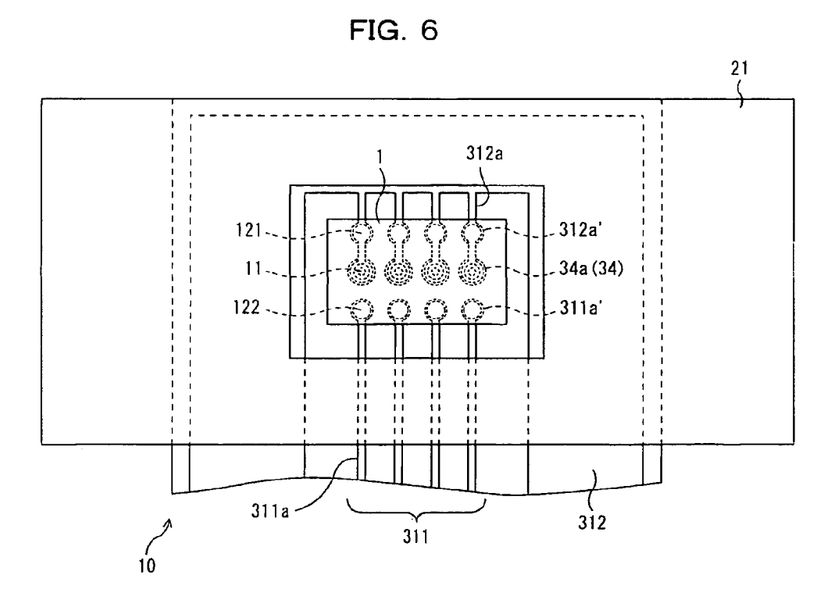
FIG. 6 is an illustration of the relationship in arrangement according to the first embodiment in a case in which a surface light-emitting type optical element heat sink is mounted on an electric wiring substrate.

In this case, as shown in FIGS. 2, 5 and 6, the electric wiring pattern 312 of the electric wiring substrate 3 is formed to have an area larger than those of the electrodes 121 and 122 of the surface light-emitting type optical element 1, thereby enabling the heat generation occurring due to the light emission at the light-emitting section to be conducted with high efficiency to the electric wiring pattern 312.

In addition, as shown in FIG. 3, the through-hole 34 of the electric wiring substrate 3 is previously made at a position corresponding to the position of the light-emitting section 11 of the surface light-emitting type optical element 1 to be mounted therein. Thus, the surface light-emitting type optical element 1 is mechanically held by the electric wiring substrate 3 and, when an electric signal is supplied from the electric wiring substrate 3 to the surface light-emitting type optical element 1, the light emitted from the surface light-emitting type optical element 1 can be led through the through-hole 34 to the side of the fiber block 4 which will be mentioned below.

The fiber block 4 is mounted on the opposite surface (rear surface) of the electric wiring substrate 3 to the surface for the mounting of the surface light-emitting type optical element 1. The light from the surface light-emitting type optical element 1 is inputted through the through-hole 34 to the fiber block 4 and the inputted light then propagates through it. As shown in FIGS. 2 and 3, the fiber block 4 is composed of an optical fiber 42 made to propagate the light from the surface light-emitting type optical element 1 and a ferrule 41 made to internally accept the optical fiber 42 and fixedly secure it. In this configuration, the connection of the optical fiber 42 is made by means of a butt joint so that an end surface thereof is placed through the through-hole 34 into a confronting relation to the light-emitting section 11 of the surface light-emitting type optical element 1.

In this way, the surface light-emitting type optical element 1 and the optical fiber 42 are stably secured fixedly to each other while reducing the space or gap therebetween. In addition, the aforesaid electric wiring substrate 3 itself is used to function as a spacer between the surface light-emitting type optical element 1 and the optical fiber 42, which realizes the enhancement of efficiency and improvement of stability of the optical coupling between the surface light-emitting type optical element 1 and the fiber block 4 through the use of a reduced number of parts, i.e., only the intervention of the electric wiring substrate 3.

The heat sink 2 is mounted on the electric wiring substrate 3 to be positioned at the same plane side as the mounting plane for the surface light-emitting type optical element 1 and is designed to radiate, toward the external, the heat generated due to the light-emitting section 11 constituting a heat generation section of the surface light-emitting type optical element 1 and the heat generated due to peripheral electric circuits (not shown) including an integrated circuit used for driving the surface light-emitting type optical element 1. This heat sink 2 is made of a material having a high thermal conductivity. For this reason, the heat sink 2 is mounted on the electric wiring substrate 3 so that a portion of the electric wiring pattern 312 and a portion of the main body of the heat sink 2 are placed through an adhesion layer 331 (see FIG. 3) into an overlapping relation to each other. This allows the exhaust of the heat generated from the light-emitting section 11 constituting the heat generation section of the surface light-emitting type optical element 1.

As described above, principally, the heat generation of the surface light-emitting type optical element 1 occurs due to the light emission from the light-emitting section 11 close to the electric wiring substrate 3. The electric wiring pattern 312 made to supply a reference electric potential is positioned in the vicinity of the light-emitting section 11 as shown in FIGS. 1 and 2. Thus, the heat generated at the light-emitting section 11 can be conducted to the heat sink 2 with relatively high efficiency. The heat sink 2 is positioned to overlap the electric wiring pattern 312 so as to achieve the efficient conduction of the heat from this electric wiring pattern 312, so the heat conducted by the electric wiring pattern 312 can be radiated through the heat sink 2.

As shown in FIG. 2, the heat sink 2 is composed of a first heat sink section 21 surrounding the four sides of the surface light-emitting type optical element 1 and a second heat sink section 22 integrated with a top portion of the first heat sink section 21. Reference numeral 211 designates an opening portion of the first heat sink section 21. Preferably, this opening portion 211 is configured to have a small size for the improvement of the heat radiation effect, provided that it can accommodate the surface light-emitting type optical element 1. In addition, although, in FIGS. 1 to 3, the second heat sink section 22 is formed into a configuration covering the mounted surface light-emitting type optical element 1, other configurations are also acceptable, and it is also acceptable to omit the second heat sink section 22.

Meanwhile, as the surface light-emitting type optical element 1, it is also appropriate to employ a configuration in which, for example, four light-emitting sections 11 are arranged in parallel as illustrated in FIG. 4. In this configuration, by an electric signal to be supplied through a pair of reference electric potential electrode 121 and signal electrode 122 disposed at upper and lower positions in FIG. 4, the light-emitting section 11 positioned with respect to the corresponding reference electric potential electrode 121 can emit light.

FIG. 5 is an illustration of examples of the electric wiring patterns 311 and 312 on the electric wiring substrate 3 for the supply of an electric signal to the surface light-emitting type optical element 1 shown in FIG. 4. FIG. 6 is an illustration of the relationship in arrangement in a case in which the surface light-emitting type optical element 1 shown in FIG. 4 and the first heat sink section 21 constituting the heat sink 2 are mounted on the electric wiring substrate 3 having the electric wiring patterns 311 and 312 shown in FIG. 5.

In this case, the electric wiring pattern 311 shown in FIG. 5 has four signal lines 311a corresponding to four signal electrodes 122 in the above-mentioned surface light-emitting type optical element 1, and it further has contact points 311a' corresponding to the respective signal electrodes 122 at end portions of the respective signal lines 311a. Moreover, the electric wiring pattern 312 shown in FIG. 5 includes four overhanging sections 312a associated with the four reference electric potential electrodes 121 in the above-mentioned surface light-emitting type optical element 1, and it further contains contact portions 312a' corresponding to the respective reference electric potential electrodes 121 at the end portions of the respective overhanging sections 312a. Reference numeral 34a represents through-holes each functioning as an optical propagation path and formed in a state associated in arrangement with the above-mentioned four light-emitting sections 11.

In this configuration, as shown in FIG. 6, the positioning of the first heat sink section 21 constituting the heat sink 2 and the electric wiring pattern 312 and the respective shapes thereof are determined so as to increase the overlapping area therebetween, which can enlarge the thermal conduction cross section to improve the radiation efficiency of the generated heat from the light-emitting section 11, which is to be conducted to the electric wiring pattern 312 and radiated through the heat sink 2. In addition, in such a manner that the electric wiring pattern 312 is made to have an area larger than that of the reference electric potential electrode 121 of the surface light-emitting type optical element 1, the thermal conduction cross section increases, thereby enabling the enhancement of the heat radiation efficiency.

Moreover, also with respect to the fiber block 4 to be mounted on the surface opposite to the mounting surface for the surface light-emitting type optical element 1 on the electric wiring substrate 3, four optical fibers 42 can be fixedly secured to the ferrule 41 in a state associated with the four light-emitting sections 11 of the surface light-emitting type optical element 1.

Figure 7A:
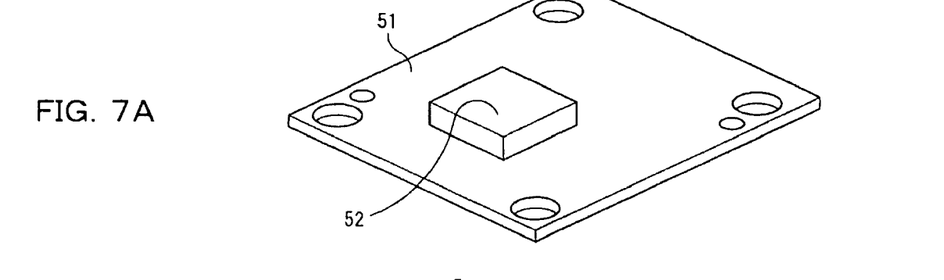
FIGS. 7A to 7D are illustrations for explaining a manufacturing process for an optical transmitter module according to the first embodiment.
Figure 7B:
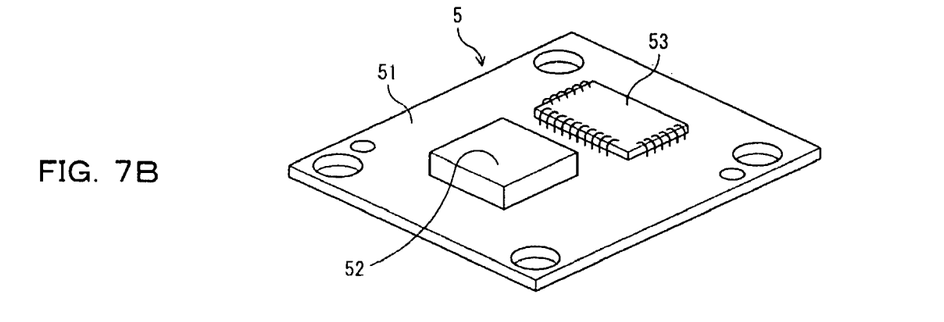
Figure 7C:
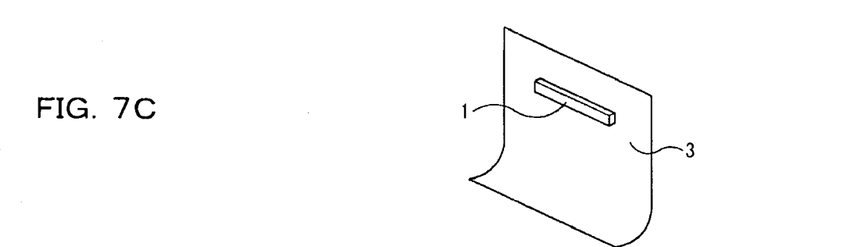
Figure 7D:
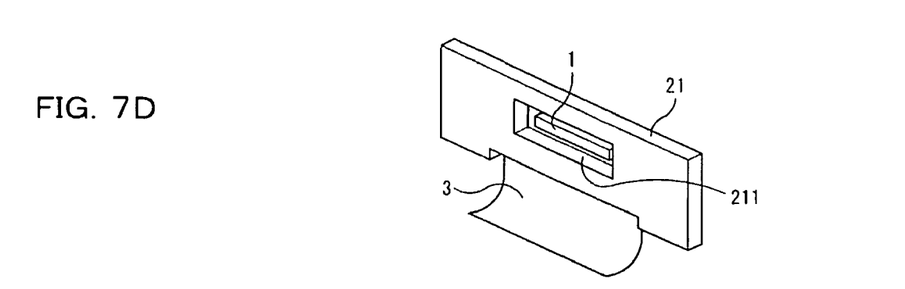
Figure 8A:
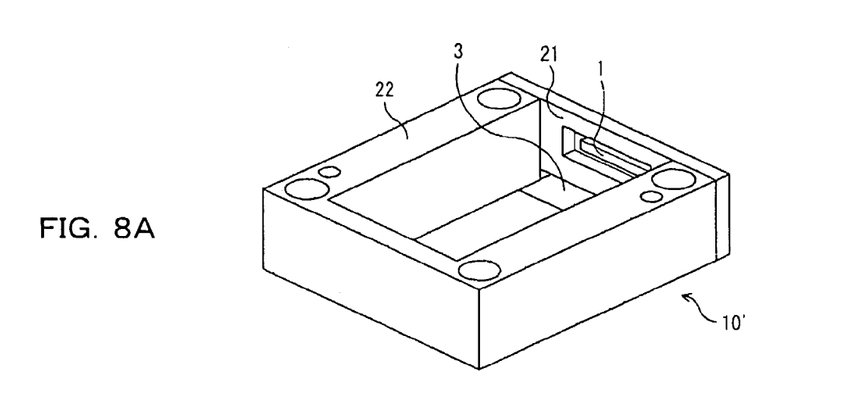
FIGS. 8A to 8C are illustrations for explaining a manufacturing process for an optical transmitter module according to the first embodiment.
Figure 8B:
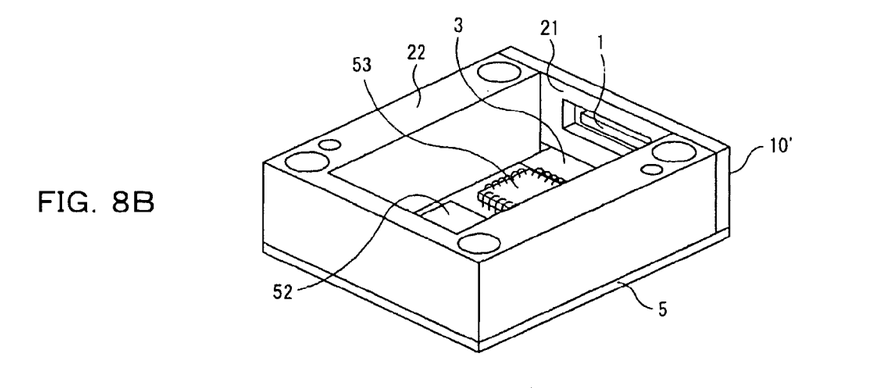
Figure 8C:
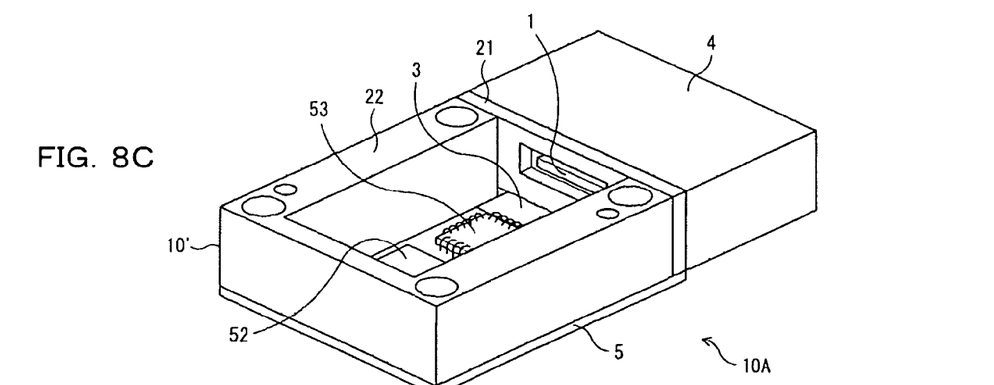

The optical module 10 thus configured according to the first embodiment can be made as an optical transmitter module 10A, shown in FIG. 8C, according to a packaging process to a module substrate holding an integrated circuit for driving the surface light-emitting type optical element 1and carrying other parts. This optical transmitter module 10A can be produced in accordance with a process shown in FIGS. 7A to 7D and FIGS. 8A to 8C.

First of all, as shown in FIG. 7A, as an electric circuit arrangement for driving the optical module 10, electric circuit elements 52 including a chip capacitor, a chip resistor or a signal processing processor and others are mounted on a module substrate 51. Subsequently, as shown in FIG. 7B, an IC (Integrated Circuit) chip 53 for driving the surface light-emitting type optical element 1 is packaged on the module substrate 51, thus configuring a module substrate circuit 5.

On the other hand, as a process of manufacturing the optical module 10, as shown in FIG. 7C, the surface light-emitting type optical element 1 is mounted on the electric wiring substrate 3 (as shown in FIG. 3, in this electric wiring substrate 3, the electric wiring patterns 311, 312 and the through-hole 34 serving as an optical propagation path are formed in advance on the substrate made from a flexible wiring film), thereby making an electrical connection with the electric wiring patterns 311 and 312. At this time, the mounting thereof is carried out so that the light-emitting section 11 serving as a heat generation section is located relatively close to the substrate surface side of the electric wiring substrate 3 (confronting the substrate surface).

Subsequently to this, as shown in FIG. 7D, the first heat sink section 21 constituting the heat sink 2 is fixedly secured onto the electric wiring substrate 3. At this time, it is also appropriate that the opening portion 211 of the first heat sink section 21 is filled with a chip coat resin and cured.

Still moreover, as shown in FIG. 8A, the second heat sink section 22 is adhered onto the first heat sink section 21 to be integrated therewith, thus building up an optical sub-assembly 10'. In FIGS. 8A to 8C, as the second heat sink section 22, there is shown a configuration also used as a module housing. Yet moreover, a portion of the electric wiring substrate 3 which is not associated with the heat sink 2 is properly bent for the electrical connection with the module substrate circuit 5, configured as shown in FIG. 7B, in the next process.

After this, as shown in FIG. 8B, the optical sub-assembly 10' configured as shown in FIG. 8A is mounted on the module substrate circuit 5 assembled in the process shown in FIGS. 7A and 7B, and an electrical connection is made between the drive IC chip 53 and the electric wiring patterns 311 and 312. At this time, the respective electric circuit elements on the module substrate circuit 5 can also be covered with a chip coat resin.

Moreover, after the mounting of the optical sub-assembly 10' on the module substrate circuit 5 as shown in FIG. 8B, the fiber block 4 is connected to the surface of the electric wiring substrate 3 opposite to the mounting side of surface light-emitting type optical element 1 as shown in FIG. 8C, thus completing the optical transmitter module 10A.

In the optical transmitter module 10A configured as mentioned above, an electric signal supplied from the drive IC chip 53 is supplied to the signal electrode 122 of the surface light-emitting type optical element 1 through the electric wiring pattern 311 of the electric wiring substrate 3 shown in FIGS. 2 and 3. This enables the surface light-emitting type optical element 1 to be driven so as to output signal light from the light-emitting section 11. The signal light outputted from the light-emitting section 11 is optically coupled to the optical fiber 42 with high efficiency through the through-hole 34. In this way, the signal light can stably propagate through the optical fiber 42.

Although the light-emitting section 11 of the surface light-emitting type optical element 1 generates heat due to light emission, the generated heat can be radiated through the heat sink 2 together with the heat generated due to the circuit operation in the module substrate circuit 5 shown in FIGS. 7B and 8C. In particular, the heat generated at the light-emitting section 11 can be radiated through the electric wiring pattern 312 close to the disposed position of the light-emitting section 11 and the heat sink 2, thereby suppressing the increase in temperature of the light-emitting section 11 and controlling the decrease in outputted optical power with high efficiency.

For example, although in the case of the above-mentioned conventional configuration shown in FIG. 17 the heat sink 108 is disposed on the rear side of the light-emitting surface of the semiconductor optical element 101, according to the invention of the subject application, the heat is radiated through the electric wiring pattern 312 with a high thermal conductivity formed at a position close to the light-emitting section 11. Thus, the distance between the light-emitting section 11 and the electric wiring pattern 312 conducting the heat generated by the light-emitting section 11 according to the first embodiment can be shorten in comparison with the distance between the light-emitting section of the optical element 101 and the heat sink 108 in the configuration shown in FIG. 17. Therefore, for example, in the case of the configuration of the conventional technique, the temperature increase reaches approximately 27.4° C., while according to the configuration according to this embodiment the temperature increase stands at approximately 8.2° C. Thus, it is possible to enhance the efficiency of the heat radiation.

As described above, an optical module according to the first embodiment of the present invention comprises the surface light-emitting optical element 1 mounted on the electric wiring substrate 3 so that the light-emitting section 11 serving as a heat generation section is placed relatively close to a substrate surface side of the electric wiring substrate 3 and the heat sink 2 mounted on the same plane as the mounting plane of the surface light-emitting type optical element 1 on the electric wiring substrate 3, the heat sink 2 being mounted on the electric wiring substrate 3 so that a portion of an electric wiring of the electric wiring substrate 3 overlaps a portion of the heat sink 2. This enables the heat to be exhausted from the side of the optical element light-emitting surface of the surface light-emitting type optical element 1 which shows the highest heating value, which can eliminate the need for the employment of a heat radiation path to the rear surface of the surface light-emitting type optical element 1 showing a low thermal conductivity, thereby providing an advantage of improving the efficiency of the heat radiation to the exterior of the optical element.

In addition, the electric wiring pattern 312 is provided which has an area larger than that of the reference electric potential electrode 121 of the optical element, thus enlarging the thermal conduction cross section which leads to the enhancement of the efficiency of the heat radiation.

Still additionally, the region of the wiring pattern 312 is formed so as to overlap the heat sink 2 in the vicinity of the optical element, thereby enabling the enlargement of the thermal conduction cross section.

As a result, the heat generated at the drive of the surface light-emitting type optical element 1 can be exhausted to the exterior of the module with high efficiency, which can suppress the decrease in optical output power and contribute greatly to the reduction of the dissipation power of the optical transmission module.

[B] DESCRIPTION OF SECOND EMBODIMENT

Figure 9:
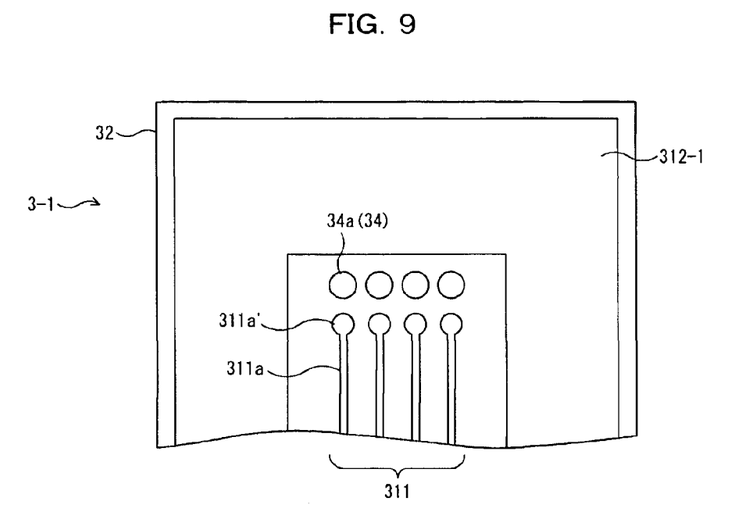
FIG. 9 is an illustration of a second embodiment of the present invention.
Figure 10:
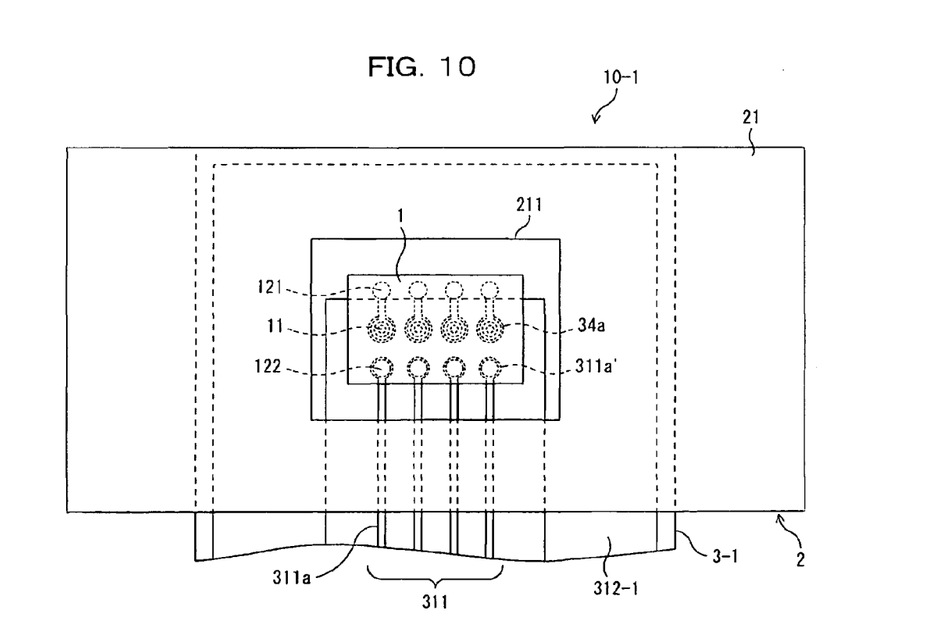
FIG. 10 is an illustration of the second embodiment of the present invention.

FIGS. 9 and 10 are illustrations of a second embodiment of the present invention. FIG. 9 is a top view illustratively showing an electric wiring substrate 3-1 according to the second embodiment, and FIG. 10 is a top view illustratively showing an optical module 10-1 in which a surface light-emitting type optical element 1 and a heat sink 2 are mounted on the electric wiring substrate 3-1.

In comparison with the above-described optical module 10 according to the first embodiment, in this optical module 10-1 according to the second embodiment, an electric wiring pattern 312-1 constituting the electric wiring substrate 3-1 differs in pattern shape therefrom, and other configurations are basically similar to those of the above-described first embodiment. In FIGS. 9 and 10, the same reference numerals as those in FIGS. 5 and 6 designate almost similar parts.

That is, as shown in FIGS. 9 and 10, different from the aforesaid configuration in FIGS. 5 and 6, the electric wiring pattern 312-1 does not have the four overhanging regions 312a formed in a state associated with the four reference electric potential electrodes 121. In the electric wiring pattern 312-1, the area forming the contact points with the four reference electric potential electrodes 121 is formed into an even pattern so as to correspond to the even pattern configuration of the horseshoe-like outer circumferential section.

Also in the optical module 10-1 thus configured, by means of the electric wiring pattern 312-1 and the heat sink 2, it is possible to provide the advantages similar to those of the first embodiment.

[C] DESCRIPTION OF THIRD EMBODIMENT

Figure 11:
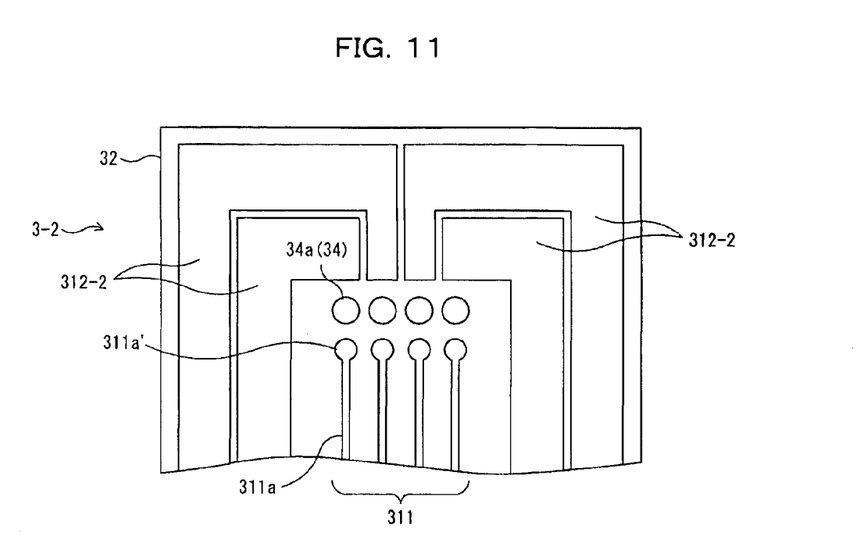
FIG. 11 is an illustration of a third embodiment of the present invention.
Figure 12:
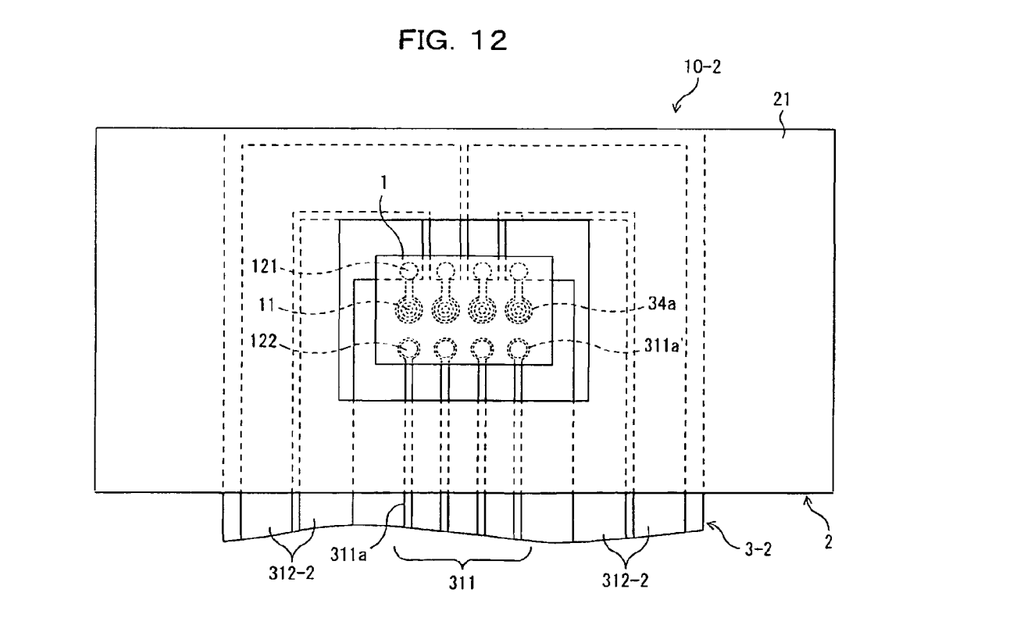
FIG. 12 is an illustration of the third embodiment of the present invention.

FIGS. 11 and 12 are illustrations of a third embodiment of the present invention. FIG. 11 is a top view illustratively showing an electric wiring substrate 3-2 according to the third embodiment, and FIG. 12 is a top view illustratively showing an optical module 10-2 in which a surface light-emitting type optical element 1 and a heat sink 2 are mounted on the electric wiring substrate 3-2.

The optical module 10-2 according to the third embodiment differs from the above-described first and second embodiments in that, in the surface light-emitting type optical element 1 having the configuration shown in FIG. 4, an electric wiring pattern 312-2 for the supply of a reference voltage is also divided into four regions in order to output optical signals of independent channels from four light-emitting section 11. In FIGS. 11 and 12, the same reference numerals as those in FIGS. 5 and 6 designate almost similar parts.

That is, as shown in FIGS. 11 and 12, the electric wiring pattern 312-2, different from that shown in FIGS. 9 and 10, has an independent wiring pattern in each of the regions functioning as a contact point of each of the four reference electric potential electrodes 121. This enables different voltages to be applied to four pairs of reference electric potential electrodes 121 and signal electrodes 122 of the surface light-emitting type optical element 1, respectively, which allows different signal lights to be outputted from the four light-emitting sections 11, respectively.

Also in the case of the optical module 10-2 thus configured, it is possible to provide the advantages similar to those of the first embodiment by means of the electric wiring pattern 312-2 and the heat sink 2.

[D] OTHERS

It should be understood that the present invention is not limited to the above-described embodiments, and that it is intended to cover all changes and modifications of the embodiments of the invention herein which do not constitute departures from the spirit and scope of the invention.

Figure 13:
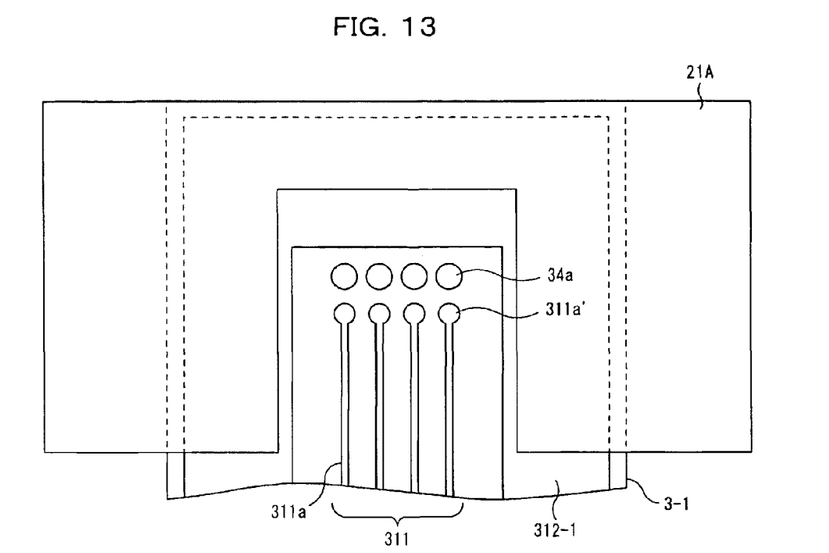
FIG. 13 is an illustration of a modification of the second embodiment of the present invention.
Figure 14:
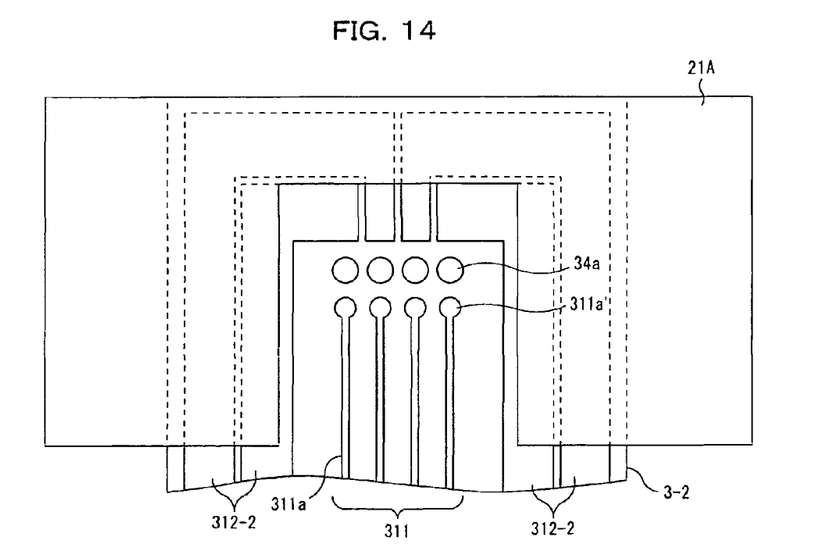
FIG. 14 is an illustration of a modification of the third embodiment of the present invention.

Concretely, although in the above-described first to third embodiments the first heat sink section 21 constituting the heat sink 2 to be mounted so as to overlap the electric wiring pattern 312, 312-1, 312-2 is formed into a frame-like configuration having the opening portion 211, according to the present invention, for example, like a first heat sink section 21A shown in FIGS. 13 and 14, it can employ a horseshoe-like configuration which does not include the formation region for the electric wiring pattern 311 serving as a signal line. Also with respect to the electric wiring substrate 3 shown in FIG. 5, it is also possible to apply a similar heat sink section 21A thereto.

Figure 15:
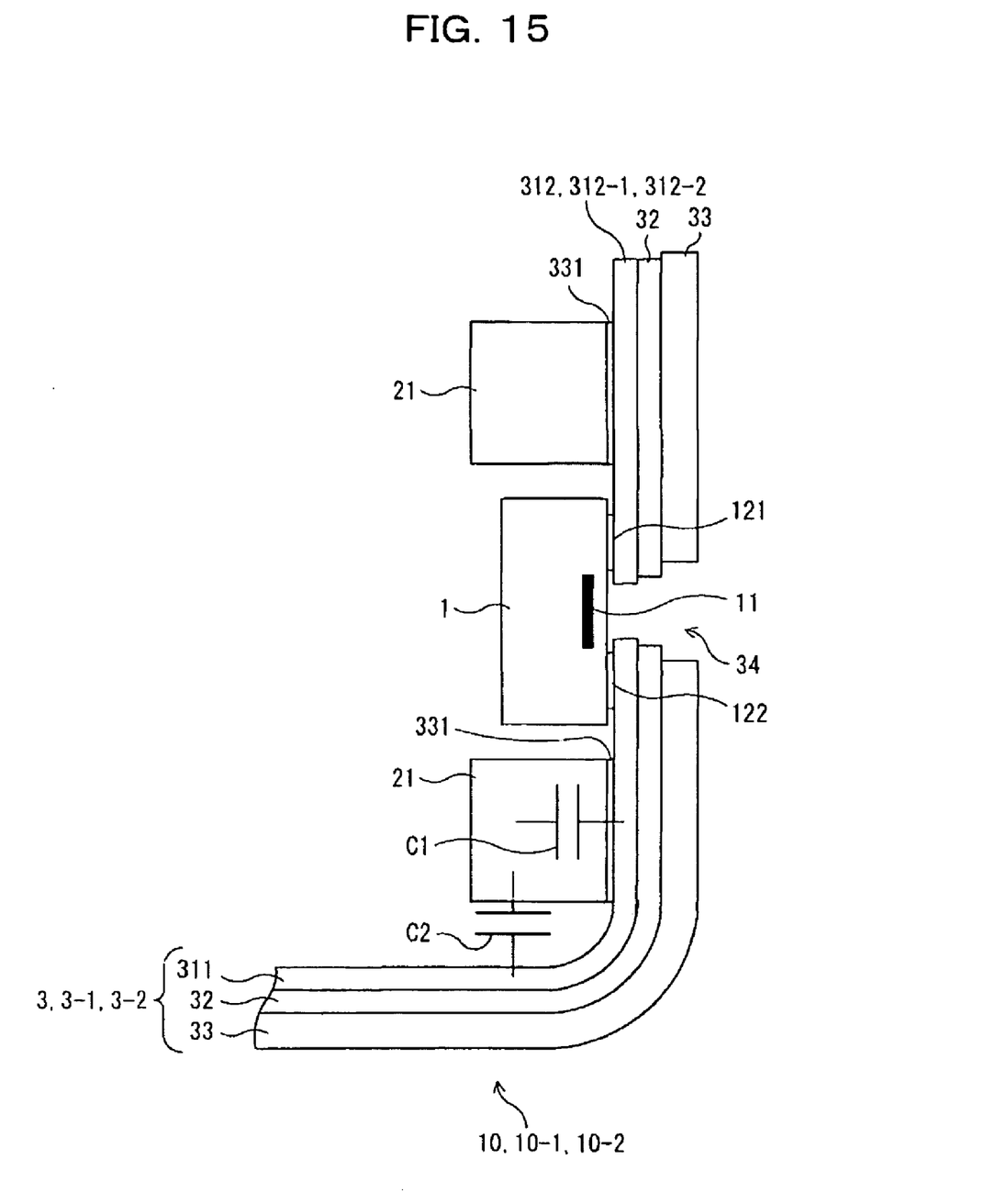
FIG. 15 is an illustration for explaining the modifications shown in FIGS. 13 and 14.

In the above-described first to third embodiments (see FIGS. 5, 10 and 12), the first heat sink section 21 also overlaps the electric wiring pattern 311 functioning as a signal line. In this case, even in a case in which the first heat sink section 21 is made of a material having an electrical conductivity, for example, an adhesion layer 331 is put therebetween as shown in FIG. 15, which keeps the electrical insulation of the first heat sink section 21 with respect to the electric wiring pattern 311.

However, in this case, the adhesion layer 331 is interposed between the electric wiring pattern 311 and the first heat sink 21, which leads virtually to the formation of a capacitor C1. This also applies to a case in which the region to be interposed therebetween is an air layer. For example, as shown in FIG. 15, also in a case in which the electric wiring substrate 3, 3-1, 3-2 is bent so that the electric wiring pattern 311 and the first heat sink section 21 are brought close to each other, a similar capacitor C2 appears. In a case in which a fast signal passes through the electric wiring pattern 311, it is considered that the capacity made in this way affects the transmission characteristic.

Figure 16:
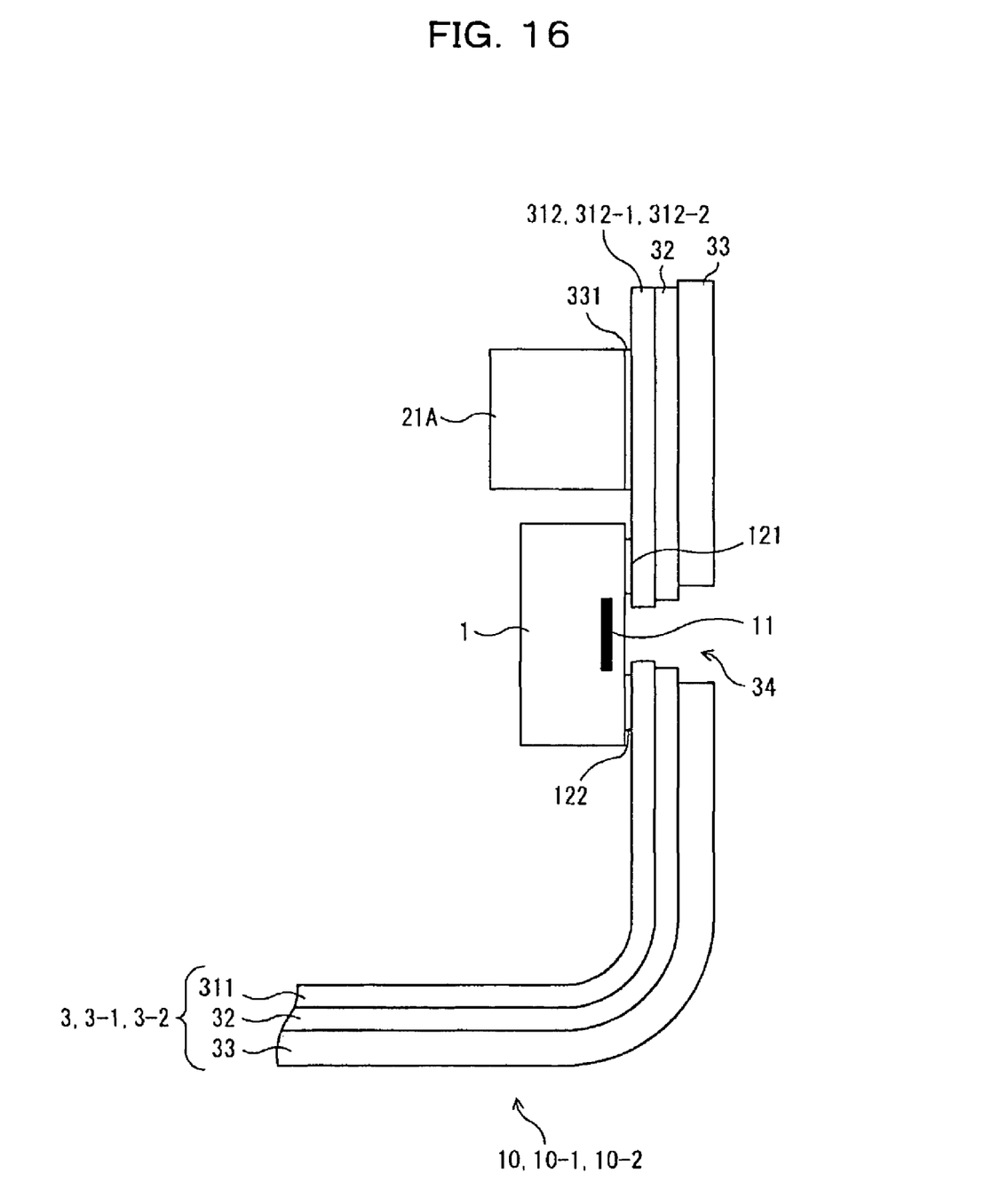
FIG. 16 is an illustration for explaining the modifications shown in FIGS. 13 and 14.

On the other hand, as exemplified by FIGS. 13 and 14, when the shape of the overlapping surface of the heat sink 2 to be mounted on the electric wiring substrate 3-1, 3-2 is set as a configuration which does not include the formation region of the electric wiring pattern 311 serving as a signal line, as shown in FIG. 16, the capacity component does not occur, so it is expectable to suppress the degradation of the transmission characteristic.

In addition, in the above-described respective embodiments, the optical fiber block is employed as the second optical element. However, according to the present invention, it is also appropriate to employ a single optical fiber or other well-known optical elements such as a light-receiving element.

The disclosure of the above-described embodiments allows the manufacturing of a device according to the present invention.

What is claimed is:

1. An optical module comprising:
   an electric wiring substrate;
   a first optical element mounted on said electric wiring substrate so that a heat generation section of said first optical element is positioned relatively close to a substrate surface of said electric wiring substrate; and
   a heat sink mounted on the same plane as a mounting plane of the first optical element on said electric wiring substrate,
   said heat sink being mounted on said electric wiring substrate so that an area of electric wiring on said electric wiring substrate overlaps said heat sink, wherein
      said first optical element is made as a surface light-emitting type optical element while a light-emitting section of said surface light-emitting type optical element is mounted on said electric wiring substrate to be positioned relatively close as said heat generation section to the substrate surface side,
      a second optical element is mounted on a surface of said electric wiring substrate opposite to the first optical element mounting surface, and
      an optical propagation path is provided on said electric wiring substrate so that light emitted from said surface light-emitting type optical element propagates and arrives at said second optical element.

2. The optical module according to claim 1, wherein an electric wiring section of said electric wiring substrate overlapping said heat sink is connected to a reference electric potential electrode of said first optical element.

3. The optical module according to claim 1, wherein a point connected electrically to an electrode portion of said first optical element in succession to said electric wiring section overlapping said heat sink has a configuration with an area larger than that of an electrode portion of said first optical element.

4. The optical module according to claim 1, wherein said heat sink has a configuration surrounding said first optical element.

5. The optical module according to claim 1, wherein said heat sink has a configuration in which an overlapping area of said heat sink with respect to said electric wiring substrate does not include a formation area of a signal line constituting said electric wiring.

6. The optical module according to claim 1, further comprising a module housing connected to said heat sink.

7. The optical module according to claim 1, wherein said heat sink is configured as a portion of a module housing.

8. The optical module according to claim 1, wherein said electric wiring substrate is made as a flexible wiring substrate.

9. The optical module according to claim 1, wherein said second optical element is made as an optical fiber or a ferrule internally including an optical fiber.

\* \* \* \* \*